United States Patent
Kim et al.

(10) Patent No.: US 9,318,510 B2
(45) Date of Patent: Apr. 19, 2016

(54) METAL WIRE, THIN-FILM TRANSISTOR SUBSTRATE AND METHOD FOR MANUFACTURING A THIN-FILM TRANSISTOR SUBSTRATE

(71) Applicant: SAMSUNG DISPLAY CO., LTD., Yongin, Gyeonggi-Do (KR)

(72) Inventors: Kyung-Seop Kim, Hwaseong-si (KR); Byeong-Beom Kim, Asan-si (KR); Sang-Won Shin, Yongin-si (KR); Dae-Young Lee, Seoul (KR); Chang-Oh Jeong, Suwon-si (KR); Joon-Yong Park, Gunpo-si (KR); Dong-Min Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 14/493,241

(22) Filed: Sep. 22, 2014

(65) Prior Publication Data

US 2015/0091004 A1  Apr. 2, 2015

(30) Foreign Application Priority Data

Sep. 27, 2013  (KR) .......................... 10-2013-0114944

(51) Int. Cl.
| | | |
|---|---|---|
| *H01L 27/12* | (2006.01) | |
| *H01L 29/786* | (2006.01) | |
| *H01L 29/66* | (2006.01) | |
| *H01L 29/45* | (2006.01) | |
| *H01L 29/49* | (2006.01) | |

(52) U.S. Cl.
CPC .......... *H01L 27/124* (2013.01); *H01L 27/1214* (2013.01); *H01L 27/1244* (2013.01); *H01L 27/1251* (2013.01); *H01L 29/45* (2013.01); *H01L 29/4908* (2013.01); *H01L 29/66757* (2013.01); *H01L 29/66765* (2013.01); *H01L 29/66969* (2013.01); *H01L 29/7869* (2013.01); *H01L 29/78669* (2013.01); *Y10T 428/2944* (2015.01)

(58) Field of Classification Search
CPC ..................... H01L 29/2003; H01L 29/66462; H01L 29/778; H01L 29/66431; H01L 29/737; H01L 21/76877; H01L 21/76897; H01L 21/76898; H01L 23/481; H01L 23/49827; H01L 27/1214; H01L 27/124; H01L 27/1251
USPC .......... 257/183, 192, 194, 200, 201, E29.246, 257/E29.252, E21.403, E21.407
See application file for complete search history.

(56) References Cited

U.S. PATENT DOCUMENTS

| | | | | |
|---|---|---|---|---|
| 5,731,216 | A | * 3/1998 | Holmberg et al. | ............... 438/30 |
| 6,524,876 | B1 | * 2/2003 | Baek et al. | ....................... 438/48 |
| 6,724,010 | B1 | * 4/2004 | Kwasnick et al. | ............... 257/59 |
| 2004/0041958 | A1 | 3/2004 | Hwang et al. | |

(Continued)

FOREIGN PATENT DOCUMENTS

| | | |
|---|---|---|
| KR | 10-2004-0021169 | 3/2004 |
| KR | 10-2004-0021260 | 3/2004 |
| KR | 10-2005-0002563 | 1/2005 |

*Primary Examiner* — Eduardo A Rodela
(74) *Attorney, Agent, or Firm* — Lewis Roca Rothgerber Christie LLP

(57) ABSTRACT

A metal wire included in a display device, the metal wire includes a first metal layer including a nickel-chromium alloy, a first transparent oxide layer disposed on the first metal layer, and a second metal layer disposed on the first transparent oxide layer.

14 Claims, 6 Drawing Sheets

(56) References Cited

U.S. PATENT DOCUMENTS

| | | |
|---|---|---|
| 2004/0263706 A1 | 12/2004 | Cho et al. |
| 2006/0180815 A1* | 8/2006 | Sarma et al. .................... 257/66 |
| 2011/0149217 A1 | 6/2011 | Yoon |
| 2012/0057106 A1 | 3/2012 | Park et al. |
| 2012/0169972 A1 | 7/2012 | Jung et al. |
| 2012/0249914 A1* | 10/2012 | Jung et al. ...................... 349/43 |
| 2012/0298984 A1* | 11/2012 | Park et al. ...................... 257/43 |

\* cited by examiner

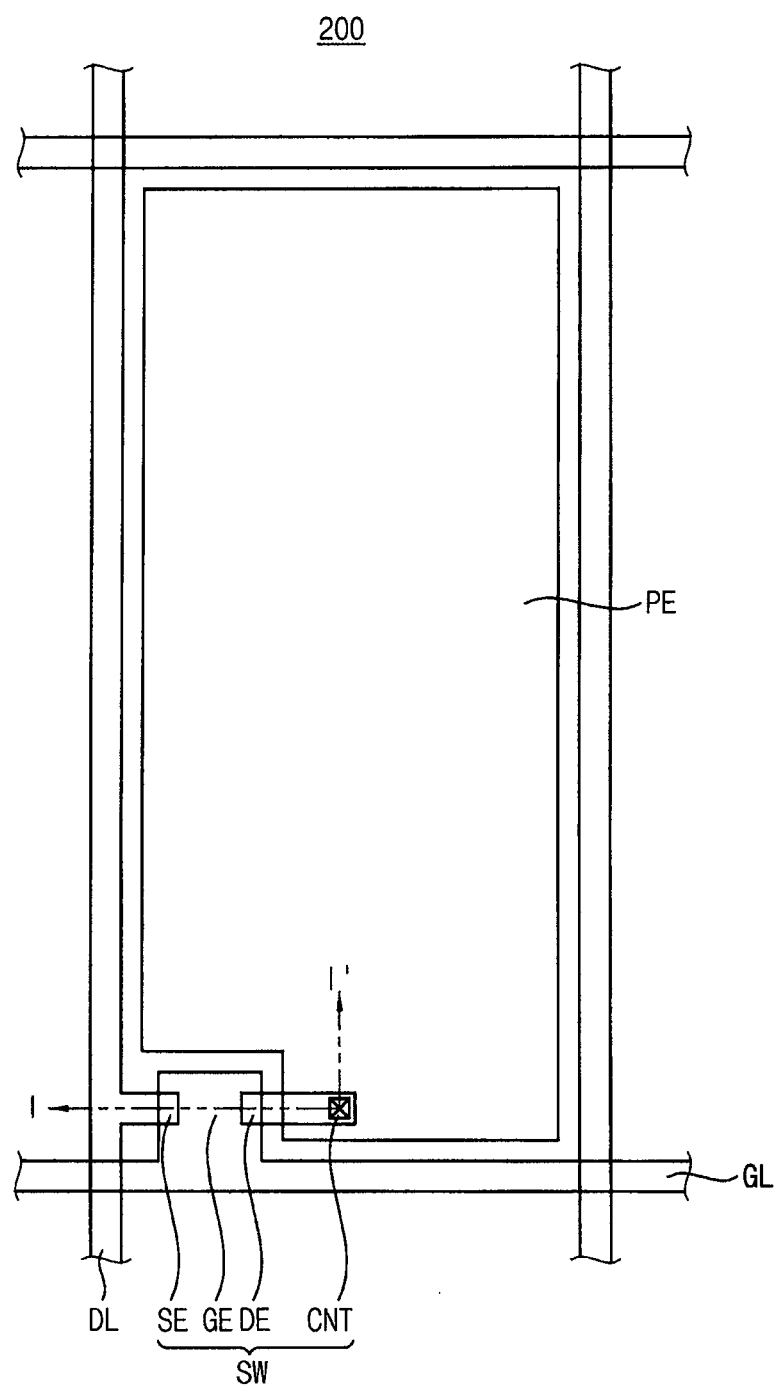

METAL WIRE, THIN-FILM TRANSISTOR SUBSTRATE AND METHOD FOR MANUFACTURING A THIN-FILM TRANSISTOR SUBSTRATE

CROSS-REFERENCE TO RELATED APPLICATION

This application claims priority to and the benefit of Korean Patent Application No. 10-2013-0114944, filed on Sep. 27, 2013 in the Korean Intellectual Property Office (KIPO), the entire disclosure of which is incorporated herein by reference.

BACKGROUND

1. Field

Example embodiments relate generally to a display device. More particularly, embodiments relate to a metal wire, a thin-film transistor substrate, and a method for manufacturing a thin-film transistor substrate.

2. Description of the Related Art

Generally, flat or curved panel displays (e.g., Liquid Crystal Displays or LCD's) include a display substrate having patterned wirings integrally formed for interconnecting circuitry such as thin-film transistors ("TFT's"), which are used as switching elements for driving corresponding pixel units of the display device. More specifically, so-called gate lines and data lines may be provided in different metal wiring layers as signal lines connected to respective TFTs for controlling charging and discharging of corresponding pixel electrodes. Yet more specifically, the gate lines are configured for transmitting corresponding gate driving signals and the data lines are configured for transmitting corresponding source driving signals for respective gate and source terminals of respective TFT's.

As the display area size of display apparatuses increase, and as customer's demand for display apparatuses having higher resolutions grow, the length of the gate lines and of the data lines increase, while at the same time the width of the gate and data lines tend to decrease, and as a result electric resistance, as seen from a signal providing source point to a TFT located at a far end of a gate or data line, undesirably increase. Copper (Cu) is a metal having relatively a low resistance, and thus a metal wire including copper has excellent electric conductivity. Furthermore, copper is relatively abundant as a natural resource. However, when the metal wires included in the display device are formed of copper as a single layer structure, adhesive strength between the substrate and the metal wires is low and the metal wires may be corroded by moisture. In addition, when the metal wires are formed of titanium-copper alloy, the substrate can be damaged because the metal wires are etched using an etchant that includes fluorine (F).

SUMMARY

Some example embodiments provide a metal wire used in a display device capable of reducing reflectance.

Some example embodiments provide a display device capable of increasing the efficiency of the manufacturing process and reducing reflectance.

Some example embodiments provide a method for manufacturing a thin-film transistor substrate.

According to some example embodiments, for a metal wire included in a display device, the metal wire may include a first metal layer including a nickel-chromium alloy, a first transparent oxide layer disposed on the first metal layer, and a second metal layer disposed on the first transparent oxide layer.

In example embodiments, the first metal layer further may include at least one selected from the group consisting of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd).

In example embodiments, a thickness of the first metal layer may be about 80 Å to about 300 Å.

In example embodiments, the first transparent oxide layer may include at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO).

In example embodiments, a thickness of the first transparent oxide layer may be about 400 Å to about 500 Å.

In example embodiments, the second metal layer may include at least one selected from the group consisting of copper (Cu), chromium (Cr), titanium (Ti), aluminum (Al), molybdenum (Mo), silver (Ag), and gold (Au).

In example embodiments, the metal wire may further include a second transparent oxide layer disposed on the second metal layer.

According to some example embodiments, a thin-film transistor substrate may include a base substrate, a gate pattern on the base substrate, the gate pattern including a gate line, and a gate electrode coupled to the gate line, a semiconductor pattern on the gate electrode, and a source pattern including a data line crossing the gate line, a source electrode overlapping the semiconductor pattern and coupled to the data line, and a drain electrode overlapping the semiconductor pattern and spaced apart from the source electrode. At least one of the gate pattern and the source pattern may include a first metal layer including a nickel-chromium alloy, a first transparent oxide layer disposed on the first metal layer, and a second metal layer disposed on the first transparent oxide layer.

In example embodiments, the first metal layer further may include at least one selected from the group consisting of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd).

In example embodiments, a thickness of the first metal layer may be about 80 Å to about 300 Å.

In example embodiments, the first transparent oxide layer may include at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO).

In example embodiments, a thickness of the first transparent oxide layer may be about 400 Å to about 500 Å.

In example embodiments, the second metal layer may include at least one selected from the group consisting of copper (Cu), chromium (Cr), titanium (Ti), aluminum (Al), molybdenum (Mo), silver (Ag), and gold (Au).

In example embodiments, at least one of the gate pattern and the source pattern may further include a second transparent oxide layer disposed on the second metal layer.

In example embodiments, the second transparent oxide layer may include at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO).

In example embodiments, the semiconductor pattern may include a semiconductor layer including an oxide semiconductor or amorphous silicon.

According to some example embodiments, a method for manufacturing a thin-film transistor substrate may include an operation of forming a gate pattern on a base substrate, the gate pattern including a gate line, and a gate electrode coupled to the gate line, an operation of forming a semiconductor pattern on the gate electrode, and an operation of forming a source pattern including a data line crossing the gate line, a source electrode overlapping the semiconductor pattern and coupled to the data line, and a drain electrode overlapping the crossing pattern and spaced apart from the source electrode. At least one of the gate pattern and the source pattern may include a first metal layer including a nickel-chromium alloy, a first transparent oxide layer disposed on the first metal layer, and a second metal layer disposed on the first transparent oxide layer.

In example embodiments, the first metal layer, the first transparent oxide layer, and the second metal layer may be simultaneously etched by wet etching.

In example embodiments, an etchant for the wet etching may include at least one of phosphoric acid, nitric acid, and acetic acid.

In example embodiments, at least one of the gate pattern and the source pattern may further include a second transparent oxide layer disposed on the second metal layer. The first metal layer, the first transparent oxide layer, the second metal layer, and the second transparent oxide layer may be simultaneously etched.

Therefore, a metal wire included in a display device according to an example embodiment may not be easily oxidized at high temperatures, may have high adhesion with a substrate, and may reduce reflectance by including a nickel-chromium alloy. The metal wire may be formed using an integrated etching process that simultaneously etches multiple layers of the metal wire, thereby increasing efficiency of the manufacturing process.

A thin-film transistor substrate including metal wire according to example embodiments may prevent corrosion of the metal wire, and may reduce the reflectance.

In addition, a method for manufacturing a thin-film transistor substrate according to example embodiments may increase the efficiency of the manufacturing process using the integrated etching process, and may prevent damage of the substrate while the metal wire is formed.

BRIEF DESCRIPTION OF THE DRAWINGS

Illustrative, non-limiting example embodiments will be more clearly understood from the following detailed description taken in conjunction with the accompanying drawings.

FIG. 2 is a plan view illustrating a thin-film transistor substrate according to example embodiments.

DETAILED DESCRIPTION

Figure 1A:
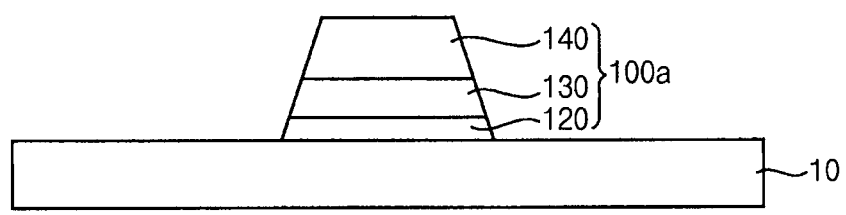
FIGS. 1A and 1B are cross-sectional views illustrating a metal wire included in a display device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
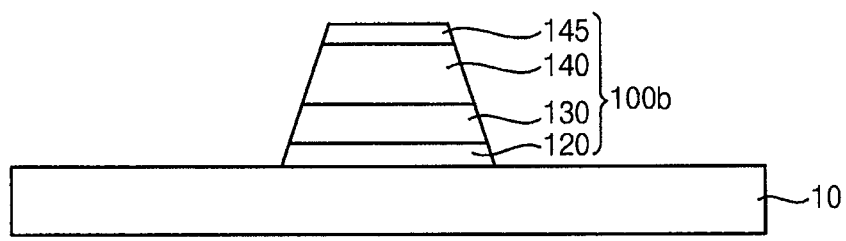

FIGS. 1A and 1B are cross-sectional views illustrating a metal wire included in a display device according to example embodiments.

Referring to FIG. 1A, a metal wire 100a included in a display device may include a first metal layer 120 including a nickel-chromium alloy (NiCr), a first transparent oxide layer 130 disposed on the first metal layer 120, and a second metal layer 140 disposed on the first transparent oxide layer 130.

The first metal layer 120 may be disposed on a base substrate 10, and may include NiCr. When first metal layer 120, is a lower layer of the metal wire 100a, includes NiCr, the metal wire 100a may not be easily oxidized even at high temperatures, may have high adhesion with a substrate, and may reduce the reflectance. The metal wire 100a that includes NiCr may not be easily oxidized at high temperatures because the diffusion coefficient of NiCr is about $1*10^{-14}$ cm$^2$/sec at about 1200 degrees C. In addition, adhesion of the metal wire 100a that includes NiCr with the base substrate 10 may be higher than adhesion of a metal wire formed by copper as a single layer structure. Therefore, the first metal layer 120 may perform a role of an adhesion layer. Furthermore, the metal wire 100a that includes NiCr may have low reflectance.

To minimize a width of the bezel and to prevent deterioration of the thin-film transistor (TFT), the TFT of the display device may be located on the upper substrate opposite the lower substrate including the backlight. When the TFT is located on the upper substrate, the TFT needs to have low reflectance for reducing reflection of external light. The metal wire 100a that includes NiCr may have low reflectance because reflectance of NiCr is about 5% to about 6%. Therefore, the display device including metal wire 100a can reduce an amount of reflected light. In one example embodiment, the first metal layer 120 may further include at least one of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd). In one example embodiment, a thickness of the first metal layer 120 may be about 80 Å to about 300 Å. In other example embodiments, to sufficiently reduce the reflectance of metal wire 100a, the thickness of the first metal layer 120 may be greater than 100 Å. In one example embodiment, the first metal layer 120, the first transparent oxide layer 130, and the second metal layer 140 are simultaneously etched by wet etching. Nickel (Ni) and chromium (Cr) layers may be etched by wet etching and the etchant for the wet etching may not include fluorine (F). Therefore, the first metal layer 120, the first transparent oxide layer 130, and the second metal layer 140 may be simultaneously etched without damage of the base substrate 10.

The first transparent oxide layer 130 may be disposed on the first metal layer 120. The first transparent oxide layer 130 may further reduce the reflectance and may lower the resistance of the metal wire 100a. The first transparent oxide layer 130 may include material that has a low refractive index and a high absorption rate to reduce the reflectance of the metal wire 100a. In one example embodiment, the first transparent oxide layer 130 may include at least one of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO). In one example embodiment, a thickness of the first transparent oxide layer 130 may be about 400 Å to about 500 Å. In other example embodiments, to sufficiently reduce the reflectance and to sufficiently lower the resistance of the metal wire 100a, the thickness of the first transparent oxide layer 130 may be greater than about 450 Å.

The second metal layer 140 may be disposed on the first transparent oxide layer 130. The second metal layer 140 may include a material that has low resistance and high electric conductivity to improve performance of the metal wire 100a. In addition, the second metal layer 140 may include material that can be simultaneously etched with the first metal layer 120 and the first transparent oxide layer 130. In one example embodiment, the second metal layer 140 may include at least one of copper (Cu), chromium (Cr), titanium (Ti), aluminum (Al), molybdenum (Mo), silver (Ag), and gold (Au).

Referring to FIG. 1B, a metal wire 100b included in a display device includes a first metal layer 120, a first transparent oxide layer 130, and a second metal layer 140. In addition, the metal wire 100b may further include a second transparent oxide layer 145 that is disposed on the second metal layer 140.

Although the second transparent oxide layer 145 may be disposed on the second metal layer 140, the second transparent oxide layer 145 may also be disposed between the second metal layer 140 and an insulation layer that includes silicon nitride or the like, and thus may prevent reaction between the second metal layer 140 and the insulation layer. Accordingly, the second transparent oxide layer 145 can prevent a gas from being generated between the second metal layer 140 and the insulation layer. In one example embodiment, the second transparent oxide layer 145 may include at least one of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO).

At least one of a gate line, a gate electrode, a data line, a source electrode, and a drain electrode of the display device according to some example embodiments may include the metal wire 100a of FIG. 1A or the metal wire 100b of FIG. 1B.

Figure 3:
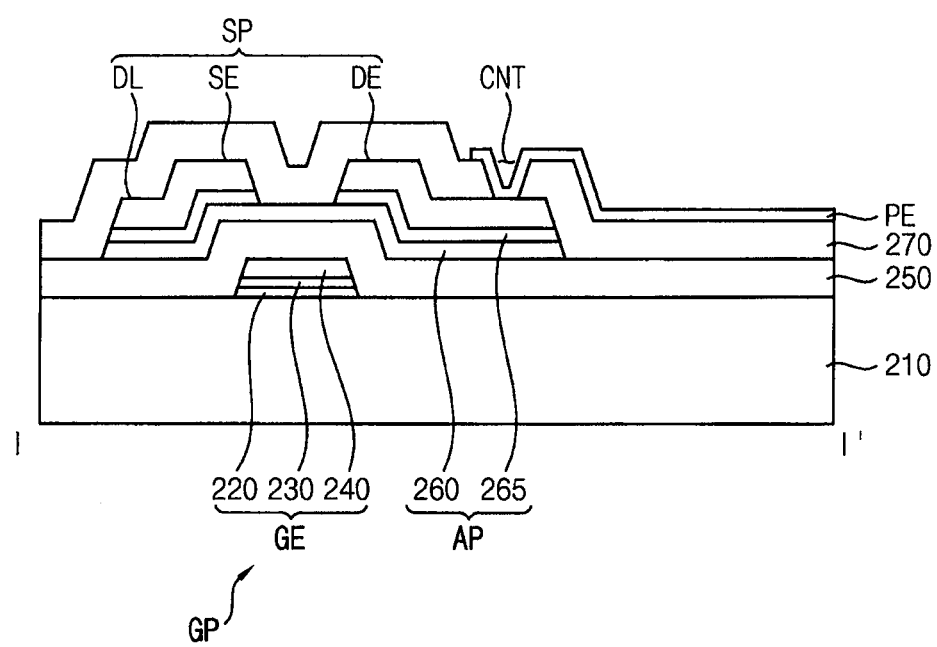
FIG. 3 is a cross-sectional view taken along the line I-I' of FIG. 2.

FIG. 2 is a plan view illustrating a thin-film transistor substrate according to example embodiments. FIG. 3 is a cross-sectional view taken along the line I-I' of FIG. 2.

Referring to FIG. 2, a TFT substrate 200 may include a gate line GL, a data line DL crossing the gate line GL, a thin-film transistor (TFT) SW as a switching element for driving a pixel, and a pixel electrode PE. The TFT SW may be coupled to the gate line GL and the data line DL. The pixel electrode PE may contact the TFT SW through a contact hole CNT.

Hereinafter, the gate line GL and any line or pattern formed simultaneously with the gate line GL may be collectively referred to as a "gate pattern GP." The lines or patterns (including the gate line GL) of the gate pattern GP may have substantially the same stacked structure as each other. In addition, the data line DL and any line or pattern formed simultaneously with the data line DL may be collectively referred to as a "source pattern SP." The lines or patterns (including the data line DL) of the source pattern SP may have substantially the same stacked structure as each other.

Referring to FIG. 3, the TFT substrate 200 may include a base substrate 210, a gate electrode GE, a first insulation layer 250, a semiconductor pattern AP, a source pattern SP, a second insulation layer 270, and a pixel electrode PE.

The base substrate 210 may include a glass substrate, a quartz substrate, a silicon substrate, a plastic substrate or the like.

The gate pattern GP may be disposed on the base substrate 210. The gate pattern GP may include the gate line GL and the gate electrode GE of the TFT SW connected to the gate line GL. Although FIG. 3 shows only the layer structure of the gate electrode GE, the layer structure of the gate line GL may be substantially the same as that of the gate electrode GE. Thus, the gate pattern GP may include a first metal layer 220 including NiCr, a first transparent oxide layer 230 disposed on the first metal layer 220, and a second metal layer 240 disposed on the first transparent oxide layer 230. In one example embodiment, the first metal layer 220 may further include at least one of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd). In one example embodiment, a thickness of the first metal layer 220 may be about 80 Å to about 300 Å. In one example embodiment, the first transparent oxide layer 230 may include at least one of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO). In one example embodiment, a thickness of the first transparent oxide layer 230 may be about 400 Å to about 500 Å. In one example embodiment, the second metal layer 240 includes at least one of copper (Cu), chromium (Cr), titanium (Ti), aluminum (Al), molybdenum (Mo), silver (Ag), and gold (Au). In one example embodiment, the gate pattern GP may further include a second transparent oxide layer disposed on the second metal layer 240. The first metal layer 220, the first transparent oxide layer 230, the second metal layer 240, and the second transparent oxide layer are described above, and duplicative descriptions will be omitted herein.

The first insulation layer 250 may entirely cover the base substrate 210 on which the gate pattern GP is formed. The first insulation layer 250 may include silicon nitride and/or silicon oxide.

The semiconductor pattern AP may be formed on the first insulation layer 250 at a region including the gate electrode GE. The semiconductor pattern AP may overlap the gate electrode GE and may partially overlap the source electrode SE and the drain electrode DE. The semiconductor pattern AP may be disposed between the gate electrode GE and the source electrode SE and between the gate electrode GE and the drain electrode DE. The semiconductor pattern AP may include a semiconductor layer 260 and an ohmic contact layer 265 formed on the semiconductor layer 260. The semiconductor layer 260 may include a semiconductor material such as silicon. In one example embodiment, the semiconductor layer 260 may include an oxide semiconductor or amorphous silicon. For example, the oxide semiconductor may be indium gallium zinc oxide (IGZO), gallium zinc oxide (GZO), indium zinc oxide (IZO), or hafnium indium zinc oxide (HIZO). The ohmic contact layer 265 may be disposed between the semiconductor layer 260 and the source electrode SE and between the semiconductor layer 260 and the drain electrode DE. The ohmic contact layer 265 may include amorphous silicon into which n+ impurities are implanted at a high concentration.

The source pattern SP may include the data line DL, the source electrode SE of the TFT SW connected to the data line DL, and the drain electrode DE of the TFT SW spaced apart from the source electrode SE. The source pattern SP may include the metal wire of FIG. 1A or FIG. 1B. Thus, the source pattern SP may include the first metal layer including NiCr, the first transparent oxide layer disposed on the first metal layer, and the second metal layer disposed on the first transparent oxide layer. The first metal layer, the first transparent oxide layer, and the second metal layer are described above, duplicative descriptions will be omitted herein.

The second insulation layer 270 may cover the source pattern SP and may include the contact hole CNT partially exposing the drain electrode DE. The second insulation layer 270 may be formed from silicon nitride and/or silicon oxide.

The pixel electrode PE is formed on the second insulation layer 270 and contacts with the drain electrode DE through the contact hole CNT. Thus, the pixel electrode PE is connected to the TFT SW, the gate line GL and the data line DL. The pixel electrode PE may be formed from indium zinc oxide (IZO) or indium tin oxide (ITO).

Therefore, when a gate signal is applied to the gate electrode GE through the gate line GL, the semiconductor pattern AP is turned into an electric conductor. Thus, a data signal provided from the data line DL is transferred to the pixel electrode PE through the source electrode SE, the semiconductor pattern AP and the drain electrode DE.

Figure 4:
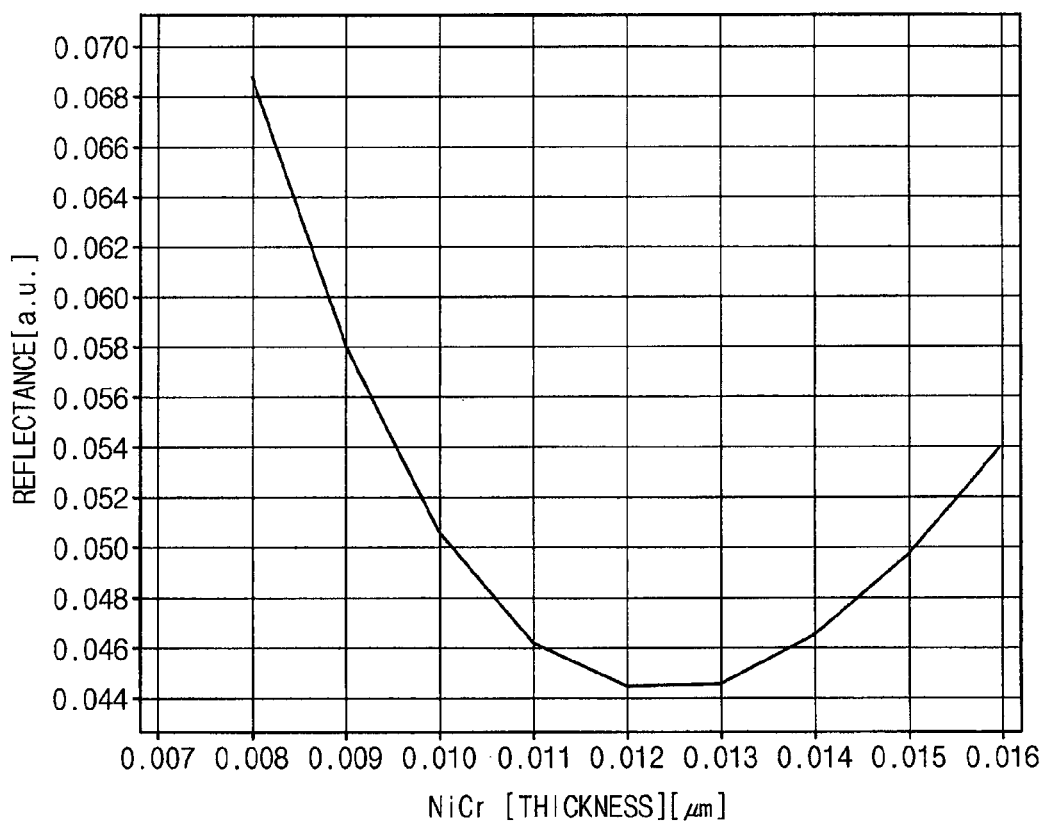
FIG. 4 is a graph of reflectance against thickness of NiCr in the thin-film transistor substrate of FIG. 2.

FIG. 4 is a graph of reflectance against thickness of NiCr in a thin-film transistor substrate of FIG. 2.

Referring to FIG. 4, when a first metal layer included in a gate pattern or a source pattern of the TFT substrate includes NiCr, the reflectance of the TFT substrate may depend on the thickness of the NiCr. If the first metal layer including the NiCr is thin, the reflectance of the TFT substrate cannot be sufficiently reduced. Therefore, to reduce sufficiently the reflectance of the TFT substrate, the thickness of the first metal layer may be greater than 80 Å. In addition, if the first metal layer is thick, the resistance of the metal wire can be increased. Thus, if the thickness of the first metal layer is increased and the thickness of the second metal layer is decreased, the electric conductivity of the TFT substrate can be lowered. Therefore, the thickness of the first metal layer may be less than 300 Å. In one example embodiment, a thickness of the first metal layer is about 80 Å to about 300 Å. To reduce the reflectance of the TFT substrate and to maintain the electric conductivity at the same time, the thickness of the first metal layer may be about 100 Å to about 150 Å.

FIGS. 5A through 5D are cross-sectional views illustrating examples of a method for manufacturing the thin-film transistor substrate of FIG. 2.

Referring to FIGS. 5A through 5D, the method for manufacturing a TFT substrate may include an operation of forming a gate pattern GP on a base substrate 210, the gate pattern GP including a gate line GL, and a gate electrode GE coupled to the gate line GL, an operation of forming a semiconductor pattern AP on the gate electrode GE, and an operation of forming a source pattern SP including a data line DL crossing the gate line GL, a source electrode SE overlapping the semiconductor pattern AP and coupled to the data line DL, and a drain electrode DE overlapping the crossing pattern and spaced apart from the source electrode SE. At least one of the gate pattern GP and the source pattern SP may include a first metal layer including NiCr, a first transparent oxide layer disposed on the first metal layer, and a second metal layer disposed on the first transparent oxide layer.

Figure 5A:
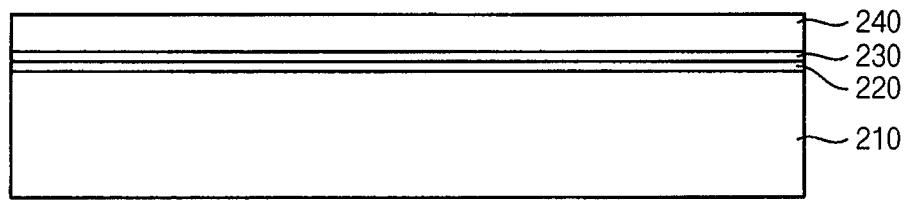
FIGS. 5A through 5D are cross-sectional views illustrating examples of a method for manufacturing the thin-film transistor substrate of FIG. 2.

Specifically, referring to FIG. 5A, to form the gate pattern that includes the gate line GL and the gate electrode GE, the first metal layer 220 including NiCr, the first transparent oxide layer 230, and the second metal layer 240 may be successively formed on the base substrate 210.

Figure 5B:
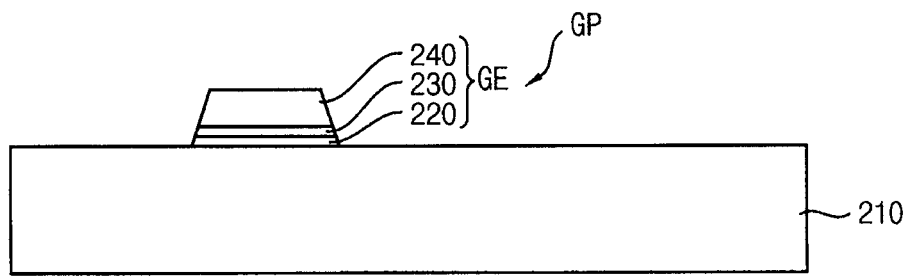

Referring to FIG. 5B, to form the gate pattern GP, the first metal layer 220, the first transparent oxide layer 230, and the second metal layer 240 may simultaneously be etched by wet etching. In one example embodiment, an etchant for the wet etching may include at least one of phosphoric acid, nitric acid, and acetic acid. The nickel (Ni) and the chromium (Cr) can be etched by wet etching and the etchant for the wet etching may not include fluorine (F). Therefore, when the gate pattern is formed, the first metal layer 220, the first transparent oxide layer 230, and the second metal layer 240 may be simultaneously etched without damage to the base substrate 210 using the etchant that does not include fluorine (F), such as PAN (Phosphoric acid, Acetic acid, and Nitric acid). In one example embodiment, the first metal layer further 220 may include at least one of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd). In one example embodiment, a thickness of the first metal layer 220 may be about 80 Å to about 300 Å. In one example embodiment, the first transparent oxide layer 230 may include at least one of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO). In one example embodiment, a thickness of the first transparent oxide layer 230 may be about 400 Å to about 500 Å. In one example embodiment, the second metal layer 240 may include at least one of copper (Cu), chromium (Cr), titanium (Ti), aluminum (Al), molybdenum (Mo), silver (Ag), and gold (Au). The first metal layer 220, the first transparent oxide layer 230, and the second metal layer 240 are described above, duplicative descriptions will be omitted herein.

In some example embodiments, the gate pattern GP may further include a second transparent oxide layer disposed on the second metal layer 240. The first metal layer 220, the first transparent oxide layer 230, the second metal layer 240, and the second transparent oxide layer may be simultaneously etched. When the gate pattern GP includes the second transparent oxide layer, the first metal layer 220, the first transparent oxide layer 230, the second metal layer 240, and the second transparent oxide layer may be simultaneously etched without damage to the base substrate 210 using the etchant that does not include fluorine (F), such as PAN. In one example embodiment, the second transparent oxide layer may include at least one of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO). The second transparent oxide layer is described above, duplicative descriptions will be omitted herein.

Figure 5C:
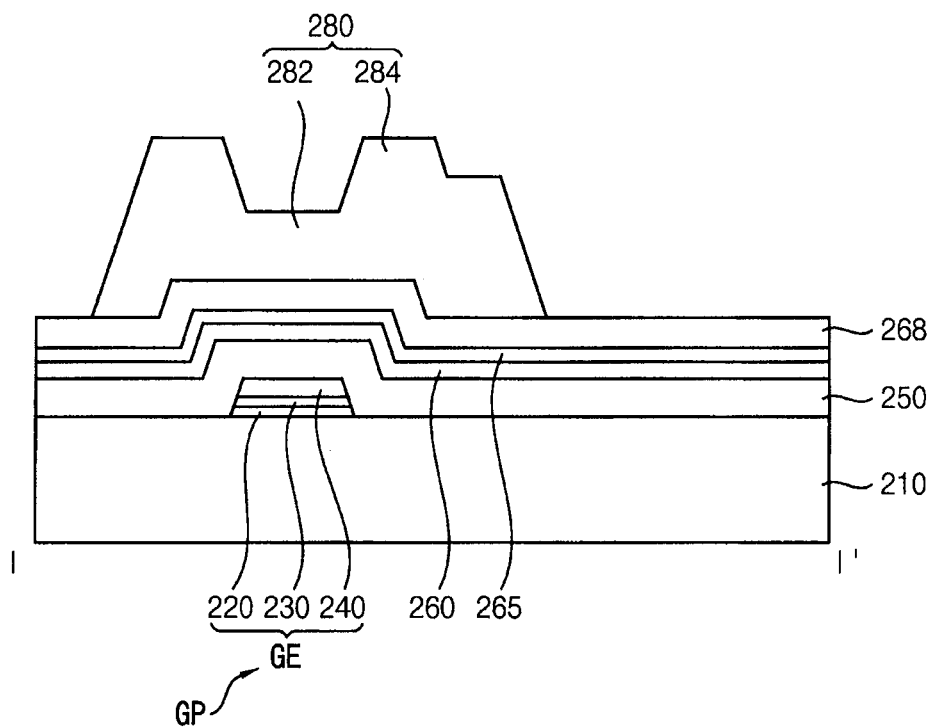
Figure 5D:
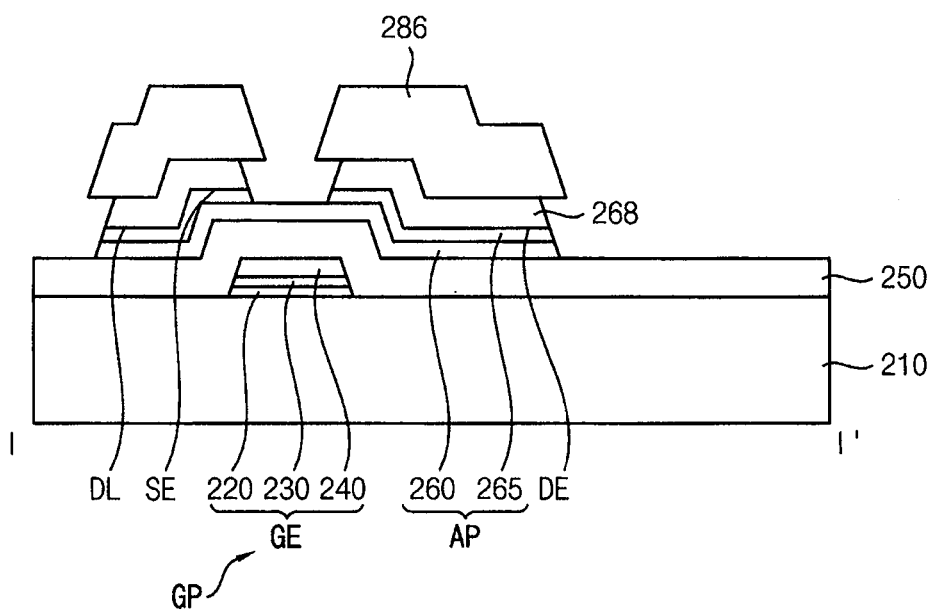

Referring to FIG. 5C, a first insulation layer 250, a semiconductor layer 260, a ohmic contact layer 265, a source pattern layer 268, and a photo pattern 280 may be successively formed on the base substrate 210 on which the gate pattern GP is formed. The first insulation layer 250, the semiconductor layer 260, the ohmic contact layer 265, and the source pattern layer 268 may entirely cover the base substrate 210. The photo pattern 280 may be formed in a forming region of the source pattern SP and a region spaced between the source electrode SE and the drain electrode DE. For example, the photo pattern 280 may be formed in forming regions of the data line DL, the source electrode SE and the drain electrode DE shown in FIG. 2 and FIG. 3, and the spaced region. The photo pattern 280 may include a first thickness portion 282 formed in the forming region of the source pattern SP and a second thickness portion 284 formed in the spaced region. The second thickness portion 284 may have a less thickness than the first thickness portion 282.

Referring to FIGS. 3 and 5C, the source pattern layer 268, the ohmic contact layer 265, and the semiconductor layer 260 may be etched using the photo pattern 280 as a mask. Removing the second thickness portion 284 from the photo pattern 280, the source electrode SE connected to the data line DL may be formed, and the drain electrode DE spaced apart from the source electrode SE may be formed, thereby forming the source pattern SP. The ohmic contact layer 265 in the spaced region may be partially removed using the source pattern SP as an etching stop layer to form the active pattern AP. The second insulation layer 270 may be formed on the base substrate 210 on which the source pattern SP is formed. The second insulation layer 270 may be patterned to form the contact hole CNT. The pixel electrode PE may be formed on the second insulation layer 270 in which the contact hole CNT is formed.

Although the example embodiments in FIGS. 5A through 5D describe the method for manufacturing the TFT substrate in which the metal wire is applied to the gate pattern GP, the metal wire also can be applied to the source pattern SP.

The present inventive concept may be applied to any electronic device having a display device. For example, the present inventive concept may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A metal wire included in a display device, the metal wire comprising:
   a first metal layer including a nickel-chromium alloy;
   a first transparent oxide layer disposed on the first metal layer;
   a second metal layer disposed on the first transparent oxide layer, and
   a second transparent oxide layer disposed on the second metal layer.

2. The metal wire of claim 1,
   wherein the first metal layer further includes at least one selected from the group consisting of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd).

3. The metal wire of claim 1,
   wherein a thickness of the first metal layer is about 80 Å to about 300 Å.

4. The metal wire of claim 1,
   wherein the first transparent oxide layer includes at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminium oxide (AlO), aluminium zinc tin oxide (AZTO), indium gallium zinc oxide (IGZO), indium oxide (InO), titanium indium zinc oxide (TIZO), and hafnium indium zinc oxide (HIZO).

5. The metal wire of claim 1, wherein a thickness of the first transparent oxide layer is about 400 Å to about 500 Å.

6. The metal wire of claim 1, wherein the second metal layer includes at least one selected from the group consisting of copper (Cu), chromium (Cr), titanium (Ti), aluminum (Al), molybdenum (Mo), silver (Ag), and gold (Au).

7. A thin-film transistor substrate comprising:
a base substrate;
a gate pattern on the base substrate, the gate pattern including a gate line, and a gate electrode coupled to the gate line;
a semiconductor pattern on the gate electrode; and
a source pattern including a data line crossing the gate line, a source electrode overlapping the semiconductor pattern and coupled to the data line, and a drain electrode overlapping the semiconductor pattern and spaced apart from the source electrode,
wherein at least one of the gate pattern and the source pattern includes:
a first metal layer including a nickel-chromium alloy;
a first transparent oxide layer disposed on the first metal layer;
a second metal layer disposed on the first transparent oxide layer, and
a second transparent oxide layer disposed on the second metal layer.

8. The thin-film transistor substrate of claim 7, wherein the first metal layer further includes at least one selected from the group consisting of vanadium (V), titanium (Ti), zirconium (Zr), aluminum (Al), iron (Fe), Indium (In), tantalum (Ta), manganese (Mn), magnesium (Mg), molybdenum (Mo), cobalt (Co), tin (Sn), tungsten (W), niobium (Nb), and neodymium (Nd).

9. The thin-film transistor substrate of claim 7, wherein a thickness of the first metal layer is about 80 Å to about 300 Å.

10. The thin-film transistor substrate of claim 7, wherein the first transparent oxide layer includes at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminium oxide (AlO), aluminium zinc tin oxide (AZTO), indium gallium zinc oxide (IGZO), indium oxide (InO), titanium indium zinc oxide (TIZO), and hafnium indium zinc oxide (HIZO).

11. The thin-film transistor substrate of claim 7, wherein a thickness of the first transparent oxide layer is about 400 Å to about 500 Å.

12. The thin-film transistor substrate of claim 7, wherein the second metal layer includes at least one selected from the group consisting of copper (Cu), chromium (Cr), titanium (Ti), aluminum (Al), molybdenum (Mo), silver (Ag), and gold (Au).

13. The thin-film transistor substrate of claim 7, wherein the second transparent oxide layer includes at least one selected from the group consisting of indium tin oxide (ITO), indium zinc oxide (IZO), zinc oxide (ZnO), gallium zinc oxide (GZO), zinc aluminum oxide (ZAO), titanium oxide (TiO), aluminum oxide (AlO), aluminum zinc tin oxide (AZTO), indium gallium zinc oxide (IGZO), indium oxide (InO), titanium indium zinc oxide (TIZO), and hafnium indium zinc oxide (HIZO).

14. The thin-film transistor substrate of claim 7, wherein the semiconductor pattern includes a semiconductor layer including an oxide semiconductor or amorphous silicon.

\* \* \* \* \*